(12) United States Patent
Xin et al.

(10) Patent No.: US 10,763,450 B2
(45) Date of Patent: Sep. 1, 2020

(54) DISPLAY SUBSTRATE, METHOD FOR MANUFACTURING DISPLAY SUBSTRATE, DISPLAY PANEL, AND DISPLAY DEVICE

(71) Applicants: Chengdu BOE Optoelectronics Technology Co., Ltd., Chengdu, Sichuan (CN); BOE Technology Group Co., Ltd., Beijing (CN)

(72) Inventors: Yanxia Xin, Beijing (CN); Zhiyong Yang, Beijing (CN); Fei Chen, Beijing (CN)

(73) Assignees: CHENGDU BOE OPTOELECTRONICS TECHNOLOGY CO., LTD, Sichuan Province (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/465,311

(22) PCT Filed: Aug. 31, 2018

(86) PCT No.: PCT/CN2018/103643
§ 371 (c)(1),
(2) Date: May 30, 2019

(87) PCT Pub. No.: WO2019/105086
PCT Pub. Date: Jun. 6, 2019

(65) Prior Publication Data
US 2019/0393440 A1 Dec. 26, 2019

(30) Foreign Application Priority Data
Nov. 30, 2017 (CN) .......................... 2017 1 1242317

(51) Int. Cl.
| | | |
|---|---|---|
| *H01L 51/52* | (2006.01) | |
| *H01L 27/32* | (2006.01) | |
| *H01L 51/56* | (2006.01) | |

(52) U.S. Cl.
CPC .......... *H01L 51/52* (2013.01); *H01L 27/3258* (2013.01); *H01L 51/56* (2013.01); *H01L 2227/323* (2013.01)

(58) Field of Classification Search
CPC ..... H01L 51/52; H01L 27/3258; H01L 51/56; H01L 2227/323; H01L 27/3276
See application file for complete search history.

(56) References Cited

U.S. PATENT DOCUMENTS

| | | |
|---|---|---|
| 6,421,033 B1 | 7/2002 | Williams et al. |
| 8,017,950 B2 | 9/2011 | Joo |

(Continued)

FOREIGN PATENT DOCUMENTS

| | | |
|---|---|---|
| CN | 1700821 A | 11/2005 |
| CN | 1992264 A | 7/2007 |
| CN | 102903856 A | 1/2013 |

OTHER PUBLICATIONS

International Search Report (including English Translation and Written Opinion) of the PCT application No. PCT/CN2018/103643 dated Nov. 19, 2018.

*Primary Examiner* — Karen Kusumakar
(74) *Attorney, Agent, or Firm* — Fay Sharpe LLP (57) ABSTRACT

The present disclosure provides a display substrate, a method for manufacturing the display substrate, a display panel, and a display device. The display substrate includes: a bonding region, and a plurality of pads disposed at intervals in the bonding region. The pads are spaced apart by an insulating layer, and a groove is set in the insulating layer between at least two adjacent pads. The groove is set in the (Continued)

insulating layer between at least two adjacent pads in the bonding region to enable the ACF to flow to the groove as pressed.

20 Claims, 3 Drawing Sheets

(56) References Cited

U.S. PATENT DOCUMENTS

| | | |
|---|---|---|
| 8,674,363 B2 | 3/2014 | Park et al. |
| 2005/0206828 A1 | 9/2005 | Lee et al. |
| 2007/0045841 A1* | 3/2007 | Cho ..................... H01L 24/83 |
| | | 257/737 |
| 2013/0026476 A1* | 1/2013 | Park ................. H01L 27/3276 |
| | | 257/59 |
| 2016/0105959 A1* | 4/2016 | Chae ................ H01L 27/3297 |
| | | 361/767 |

* cited by examiner

DISPLAY SUBSTRATE, METHOD FOR MANUFACTURING DISPLAY SUBSTRATE, DISPLAY PANEL, AND DISPLAY DEVICE

CROSS-REFERENCE TO RELATED APPLICATION

This application is a 371 of PCT Patent Application Serial No. PCT/CN2018/103643, filed on Aug. 31, 2018, which claims priority to Chinese Patent Application No. 201711242317.6, filed with the National Intellectual Property Administration of the P. R. China on Nov. 30, 2017 and entitled "DISPLAY SUBSTRATE, METHOD FOR MANUFACTURING DISPLAY SUBSTRATE, DISPLAY PANEL, AND DISPLAY DEVICE", the entire contents of which are incorporated herein by reference.

TECHNICAL FIELD

The present disclosure relates to a display substrate, a method for manufacturing a display substrate, a display panel, and a display device.

BACKGROUND

In recent years, organic light-emitting diode (OLED) displays are receiving more and more attention from the industry due to their excellent performance. Compared with liquid crystal displays (LCDs) that currently hold the major market share, OLED displays have a series of advantages such as light weight, small thickness, low power consumption, bright colors, fast response, wide viewing angle, soft display, and the like.

As an important step in the process technology for a whole OLED display, bonding refers to a process during the manufacturing process of the OLED display to connect and conduct pads in the bonding region of the OLED panel and pins of the driving integrated circuit (IC) by an anisotropic conductive film (ACF) in accordance with a certain workflow.

SUMMARY

Embodiments of the present disclosure provide a display substrate, a method for manufacturing a display substrate, a display panel, and a display device.

At least one embodiment of the present disclosure provides a display substrate, comprising: a bonding region; a plurality of pads at intervals in the bonding region; and an insulating layer for spacing apart the pads, wherein a groove is on the insulating layer between at least two adjacent pads, and the groove is configured to accommodate an overflow anisotropic conductive film during a bonding process.

In an implementation of the embodiment of the present disclosure, the groove is between any two adjacent pads.

In an implementation of the embodiment of the present disclosure, the pads comprise input pads and output pads, and the bonding region comprises a first region and a second region at intervals, wherein the input pads are in the first region, the output pads are in the second region, and the groove is between the first region and the second region.

In an implementation of the embodiment of the present disclosure, the insulating layer comprises a plurality of sub-insulating layers sequentially disposed on a base substrate, and a depth of the groove is no less than a thickness of an uppermost sub-insulating layer among the plurality of sub-insulating layers, wherein the uppermost sub-insulating layer is a sub-insulating layer farthest from the base substrate.

In an implementation of the embodiment of the present disclosure, the depth of the groove is equal to a thickness of the insulating layer.

In an implementation of the embodiment of the present disclosure, the display substrate further comprises: a base substrate, an active layer, a first metal layer, a second metal layer, a drain/source metal layer, a flat layer, an anode, a pixel defining layer, a light-emitting layer and a cathode, wherein the insulating layer comprises a buffer layer, a first insulating layer, a second insulating layer, and an interlayer insulating layer; the buffer layer, the active layer, the first insulating layer, the first metal layer, the second insulating layer, the second metal layer, the interlayer insulating layer, the source/drain metal layer, the flat layer, the anode, the pixel defining layer, the light-emitting layer, and the cathode are sequentially on the base substrate; and a depth of the groove is no less than a sum of thicknesses of the second insulating layer and the interlayer insulating layer.

At least one embodiment of the present disclosure provides a display panel, comprising: a display substrate; wherein the display substrate comprises: a bonding region; a plurality of pads at intervals in the bonding region; and an insulating layer for spacing apart the pads, wherein a groove is on the insulating layer between at least two adjacent pads.

In an implementation of the embodiment of the present disclosure, the groove is between any two adjacent pads.

In an implementation of the embodiment of the present disclosure, the pads comprise input pads and output pads, and the bonding region comprises a first region and a second region at intervals, wherein the input pads are in the first region, the output pads are in the second region, and the groove is between the first region and the second region.

In an implementation of the embodiment of the present disclosure, the insulating layer comprises a plurality of sub-insulating layers sequentially on a base substrate, and a depth of the groove is no less than a thickness of an uppermost sub-insulating layer among the plurality of sub-insulating layers, wherein the uppermost sub-insulating layer is a sub-insulating layer farthest from the base substrate.

In an implementation of the embodiment of the present disclosure, a depth of the groove is equal to a thickness of the insulating layer.

In an implementation of the embodiment of the present disclosure, the depth of the groove is no less than a sum of thicknesses of two uppermost sub-insulating layers among the plurality of sub-insulating layers, wherein the uppermost sub-insulating layer is a sub-insulating layer farthest from the base substrate.

In an implementation of the embodiment of the present disclosure, the depth of the groove is equal to the thickness of the insulating layer.

In an implementation of the embodiment of the present disclosure, the display substrate further comprises: a base substrate, an active layer, a first metal layer, a second metal layer, a drain/source metal layer, a flat layer, an anode, a pixel defining layer, a light-emitting layer and a cathode, wherein the insulating layer comprises a buffer layer, a first insulating layer, a second insulating layer, and an interlayer insulating layer; the buffer layer, the active layer, the first insulating layer, the first metal layer, the second insulating layer, the second metal layer, the interlayer insulating layer, the source/drain metal layer, the flat layer, the anode, the pixel defining layer, the light-emitting layer, and the cathode sequentially on the base substrate, wherein a depth of the groove is no less than a sum of thicknesses of the second insulating layer and the interlayer insulating layer.

At least one embodiment of the present disclosure provides a display substrate, comprising: a base substrate; at least one insulating layer on a side of the base substrate; a first pad array on a side of the at least one insulating layer away from the base substrate; a second pad array on the side of the at least one insulating layer away from the base substrate; a groove in the at least one insulating layer between the first pad array and the second pad array; wherein the display substrate comprises a display region and a bonding region on a side of the display region; the first pad array and the second pad array are both in the bonding region, and the first pad array is closer to the display region relative to the second pad array; and the groove is configured to accommodate an overflow anisotropic conductive film during a bonding process.

Optionally, the insulating layer comprises a plurality of sub-insulating layers sequentially on a base substrate, and a depth of the groove is no less than a thickness of an uppermost sub-insulating layer among the plurality of sub-insulating layers, wherein the uppermost sub-insulating layer is a sub-insulating layer farthest from the base substrate.

Optionally, a depth of the groove is equal to a thickness of the insulating layer.

Optionally, the display substrate further comprises: an active layer, a first metal layer, a second metal layer, a drain/source metal layer, a flat layer, an anode, a pixel defining layer, a light-emitting layer and a cathode, wherein the insulating layer comprises a buffer layer, a first insulating layer, a second insulating layer, and an interlayer insulating layer; the buffer layer, the active layer, the first insulating layer, the first metal layer, the second insulating layer, the second metal layer, the interlayer insulating layer, the source/drain metal layer, the flat layer, the anode, the pixel defining layer, the light-emitting layer, and the cathode are sequentially on the base substrate, wherein a depth of the groove is no less than a sum of thicknesses of the second insulating layer and the interlayer insulating layer.

Optionally, the bonding region is in the groove in the flat layer.

At least one embodiment of the present disclosure provides a display device, comprising the foregoing display panel.

At least one embodiment of the present disclosure provides a method for manufacturing a display substrate, comprising: forming an insulating layer with a groove and a plurality of pads in a bonding region of the display substrate, wherein the pads are disposed at intervals and spaced apart by the insulating layer, and the groove is on the insulating layer between at least two adjacent pads.

In an implementation of the embodiment of the present disclosure, the insulating layer comprises a plurality of sub-insulating layers sequentially on the base substrate, and forming an insulating layer with a groove in the bonding region of the display substrate comprises: forming a sub-insulating layer with a sub-groove when manufacturing sub-insulating layers that the groove corresponds to, wherein the sub-groove is a portion of the groove.

In an implementation of the embodiment of the present disclosure, forming a sub-insulating layers with a sub-groove when manufacturing sub-insulating layers that the groove corresponds to comprises: manufacturing a layer of insulating film; removing a portion of the insulating film between at least two adjacent pads when patterning the insulating film, to obtain a first sub-insulating layer which is any sub-insulating layer of the sub-insulating layers that the groove corresponds to.

In an implementation of the embodiment of the present disclosure, forming a sub-insulating layer with a sub-groove when manufacturing the sub-insulating layers that the groove corresponds to comprises: sequentially manufacturing at least two layers of insulating film; simultaneously patterning the at least two layers of insulating film to remove a portion of the at least two layers of insulating film between at least two adjacent pads, to obtain at least two sub-insulating layers which are at least two consecutive sub-insulating layers of the sub-insulating layers that the groove corresponds to.

In an implementation of the embodiment of the present disclosure, forming an insulating layer with a groove in the bonding region of the display substrate comprises: removing a portion of the insulating layer between at least two adjacent pads through a patterning process after manufacturing the insulating layer, to form the groove.

In an implementation of the embodiment of the present disclosure, the groove is between any two adjacent pads.

In an implementation of the embodiment of the present disclosure, the pads comprise input pads and output pads, and the bonding region comprises a first region and a second region at intervals, wherein the input pads are in the first region, the output pads are in the second region, and the groove is set between the first region and the second region.

DETAILED DESCRIPTION

The embodiments of the present disclosure will be described in further detail with reference to the accompanying drawings, to present the principles and advantages of the present disclosure more clearly.

For the convenience of description given later, the bonding of the OLED panel related to the embodiment of the present disclosure will be firstly described below with reference to FIG. 1

Figure 1:
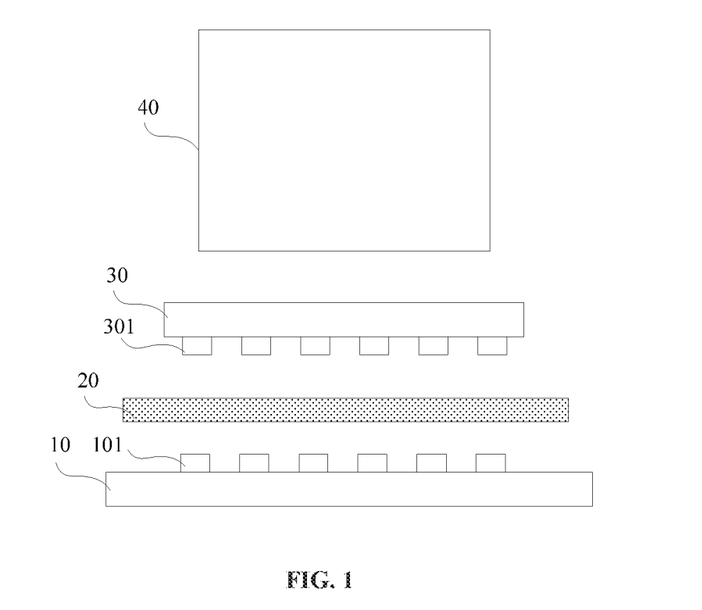
FIG. 1 is a schematic diagram illustrating bonding of the OLED panel.

FIG. 1 is a schematic diagram illustrating bonding of the OLED panel. Referring to FIG. 1, the reference sign 10 in FIG. 1 denotes a display substrate (that is, OLED substrate), 20 denotes ACF, and 30 denotes IC. During the bonding, the ACF 20 is coated to the bonding region of the display substrate 10. Then, the driving IC 30 and the display substrate 10 are pressed together under the action of a heater 40. The pad 101 positioned in the bonding region of the display substrate 10 is conducted, i.e., electrically connected, to the pad 301 of the driving IC 30 under the action of the ACF 20.

When bonding the OLED panel 10 and the driving IC 30 is implemented, due to the height limitation of the insulating layer between pads of the OLED panel 10, it is difficult for the ACF to flow in the region between the pads, which leads to glue expelling difficulty, such that the ACF between the OLED panel and the driving IC is difficult to be flattened, and may also lead to the occurrence of bubbles in the ACF and thereby affects the electrical connection between the OLED panel and the driving IC. Therefore, the embodiment of the present disclosure provides a display substrate capable of flattening the ACF between the display substrate and the driving IC.

Figure 2:
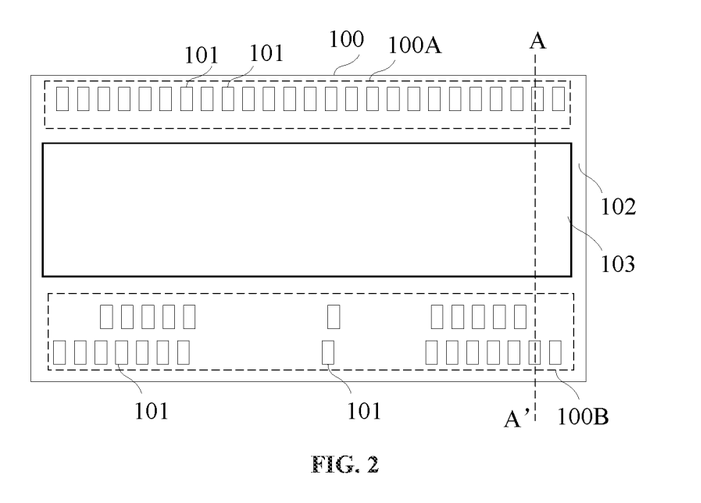
FIG. 2 is a structural schematic diagram of a display substrate provided in an embodiment of the present disclosure.

FIG. 2 is a schematic diagram illustrating structure of a display substrate provided in an embodiment of the present disclosure. Referring to FIG. 2, the display substrate includes a bonding region 100 in which a plurality of pads 101 are disposed at intervals. The pads 101 are spaced apart by an insulating layer 102, and a groove 103 is set in the insulating layer 102 between at least two adjacent pads 101 defines.

In the embodiment of the present disclosure, the groove 103 is set in the insulating layer 102 between at least two adjacent pads 101 of the bonding region to enable the ACF to flow to the groove 103 as pressed. This ensures that the ACF can be evenly distributed in the region between at least two adjacent pads, which thereby solves the problem of unevenness introduced by the difficulty in glue expelling in the ACF between the display substrate and the driving IC, avoids the occurrence of bubbles caused by unevenness of the ACF, and ensures the electrical connection between the display substrate and the driving IC.

It should be noted that the foregoing display substrate structure provided in the embodiment of the present disclosure is mainly directed to an active matrix (AM) OLED display screen. That is, the display substrate is an AMOLED display substrate. The AMOLED display substrate is designed with a thin film transistor structure therein, thus, the bonding region is provided with a relatively thick insulating layer 102, thereby easily making it difficult to flatten the ACF. Certainly, the display substrate may also be used to a passive matrix (PM) OLED display screen. That is, the display substrate is a PMOLED display substrate, which is not limited by the present disclosure.

The AMOLED display substrate includes a display region and a bonding region around the display region. The display region refers to a light-emitting region where a display unit is arranged, and the bonding region is a region where the pads connected to the IC are provided. In the AMOLED display substrate, there may be three bonding regions, which are respectively a bonding region of the driving IC (configured to display), a bonding region of a flexible printed circuit (FPC), and a bonding region of a touch IC. The bonding region 100 in the embodiment of the present disclosure may be a bonding region of a driving IC (configured to display), because the insulating layer 102 of other bonding regions usually has a smaller thickness, and thereby does not affect flattening of the ACF and has no need to define the groove 103 in general. However, the structure provided i the embodiment of the present disclosure may also be applied to other bonding regions, which is not limited by the embodiment of the present disclosure.

A brief introduction to the hierarchical structure of the display substrate in the AMOLED will be firstly made below. The display substrate, from bottom to top, includes: a base substrate, a buffer layer, an active layer, a first insulating layer, a first metal layer, a second insulating layer, a second metal layer, an interlayer insulating layer, a source/drain metal layer, a flat layer, an anode, a pixel defining layer, a light-emitting layer, and a cathode. Here, the first metal layer and the second metal layer are used for forming gate lines, gate of thin film transistors, leads (including pad leads), one electrode of storage capacitors. For example, the gate lines, the gate of the thin film transistors, the leads, and the like are formed by adopting the first metal layer, and one electrode of the storage capacitors is formed by adopting the second metal layer. Such a design may ensure the achievement of a high resolution panel. Certainly, the first metal layer and the second metal layer can also adopt other design manners. For example, the gate lines in the odd row, the gate of the thin film transistors in the odd row, and one electrode of the storage capacitors in the odd row are formed by adopting the first metal layer; the gate lines in the even row, the gate of the thin film transistors in the even row, and one electrode of the storage capacitors in the even row are formed by adopting the second metal layer; and the leads are formed on either the first or the second metal layer. The source/drain metal layer is used for forming pads, data lines, source and drain electrodes of the thin film transistors, and the other electrode of the storage capacitors.

When adopting a top-gate thin film transistor structure having three metal layers, i.e., the first metal layer, the second metal layer, and the source/drain metal layer, the insulating layer of the display substrate has many structures and thereby has a big thickness, which makes it rather difficult to flatten the ACF. Thus, regarding the display substrate of the structure, if the insulating layer of the bonding region is set with the groove, the problem that the ACF is difficult to flatten can be well solved.

In the embodiment of the present disclosure, the insulating layer may include a plurality of sub-insulating layers sequentially disposed on the base substrate. Illustratively, the insulating layer may include the buffer layer, the first insulating layer, the second insulating layer, and the interlayer insulating layer disposed on the base substrate from bottom to top. At this point, the depth of the groove is greater than or equal to the thickness of the uppermost sub-insulating layer among the plurality of sub-insulating layers.

Furthermore, the depth of the groove is greater than or equal to the sum of the thicknesses of two uppermost sub-insulating layers among the plurality of sub-insulation layers, so that the depth of the groove can ensure the ACF to expel glue smoothly. For example, when the insulating layer includes the foregoing buffer layer, first insulating layer, second insulating layer, and interlayer insulating layer, the depth of the groove 103 is greater than or equal to the sum of the thicknesses of the second insulating layer and interlayer insulating layer.

Optionally, the insulating layer set with the groove is between the layer wherein the pads are and the base substrate. Exemplarily, the pads are in the drain/source metal layer, that is, the layer where the pads are is the drain/source metal layer, and all of the buffer layer, the first insulating layer, the second insulating layer and the interlayer insulating layer are between the layer where the pads are and the base substrate.

Certainly, the display substrate adopting other types of thin film transistor structures may also adopt the above structure.

For example, the display substrate may also adopt a bottom-gate thin film transistor, in which case the film layer structure is usually a base substrate, a gate metal layer, a gate insulating layer, an active layer, a source/drain metal layer, a flat layer, an anode, a pixel defining layer, a light-emitting layer, and a cathode. At this point, the insulating layer includes a gate insulating layer disposed on the base substrate, and the depth of the groove is equal to the depth of the gate insulating layer. Under this situation, the insulating layer only includes a gate insulating layer, so that the depth of the groove is equal to the thickness of the insulating layer.

For example, in order to meet the requirement for high resolution, two metal layers are usually designed as the gate metal layer for the display substrate. However, when the resolution of the display substrate is not high, the display substrate may only include either the first metal layer or the second metal layer. Correspondingly, the display substrate may only include either the first insulating layer or the second insulating layer. In the case of designing only one metal layer and one insulating layer, the insulating layer through which the groove passes is also correspondingly reduced as subsequently designing the groove of the bonding region. For example, the insulating layer includes the buffer layer, the gate insulating layer and the interlayer insulating layer sequentially disposed on the base substrate, and the depth of the groove is greater than or equal to the sum of the thicknesses of the gate insulating layer and interlayer insulating layer. Exemplarily, the pads are in the drain/source metal layer, that is, the layer where the pads are is the drain/source metal layer, and both of the buffer layer and the gate insulating layer are between the layer where the pads are and the base substrate.

In the embodiment of the present disclosure, the base substrate may be a transparent substrate, such as, a glass substrate, a silicon substrate, a plastic substrate, or the like.

In the embodiment of the present disclosure, the first metal layer, the second metal layer, and the source/drain metal layer may be made of the same or different materials. For example, the first metal layer, the second metal layer, and the source/drain metal layer may be made of molybdenum (Mo) or titanium (Ti)/aluminum (Al)/Ti. The above materials can ensure the metal layer to have a stable performance and a low electrical resistance.

In the embodiment of the present disclosure, the buffer layer, the first insulating layer, the second insulating layer, the gate insulating layer, and the interlayer insulating layer may be a silicon nitride layer or a silicon oxynitride layer. The forgoing insulating layer manufactured by adopting a silicon nitride layer or a silicon oxynitride layer on the one hand, may have a relatively high dielectric constant, but on the other hand, may achieve the thinning these film layers. The flat layer may be a resin layer.

In the embodiment of the present disclosure, the active layer may be made of amorphous silicon, microcrystalline silicon, or polycrystalline silicon. For example, the active layer may include an amorphous silicon layer disposed on the buffer layer and an N-type doped amorphous silicon layer disposed on the amorphous silicon layer. By providing an N-type doped amorphous silicon layer on the amorphous silicon layer, the amorphous silicon layer can be prevented from directly contacting the source/drain electrodes, and the lattice mismatch between the amorphous silicon layer and the source/drain electrodes can be reduced.

In the embodiment of the present disclosure, the anode and the cathode may be an indium zinc oxide (IZO) thin film electrode or an indium tin oxide (ITO) thin film electrode.

In the embodiment of the present disclosure, the light-emitting layer may include a hole transporting sublayer, an organic light-emitting sublayer, and an electron transporting sublayer. In the embodiment of the present disclosure, the hole transporting sublayer, the organic light-emitting sublayer, and the electron transporting sublayer are all made of organic high molecular materials or organic small molecular materials.

As illustrated in FIG. 2, the pads 101 include input pads and output pads. The bonding region 100 includes a first region 100A and a second region 100B disposed respectively (i.e., disposed at intervals). The input pads are in first region 100A, and the output pads are in the second region 100B. The groove 103 is positioned between the first region 100A and the second region 100B. In this implementation manner, the pads 101 are centrally disposed in two regions, and there is a large vacant area between the two regions, thus, the groove 103 can be set in the region between the first region 100A where only the input pads are disposed and the second region 100B where only the output pad is disposed. Since the area of the portion between the first region 100A and the second region 100B is relatively large, patterning process may be easily performed if the groove 103 is set. On the one hand, the process becomes simple to implement, but on the other hand, the problem that the groove 103 set between two pads 101 in the same region cause a decrease in insulating performance between the pads 101 can be prevented. It should be noted that, in the display substrate, only the pad of the bonding region of the driving IC includes the input pads and the output pads, and both the pad of the bonding region of the FPC and the pad of the bonding region of the touch IC only include the output pad. Thus, the solution is mainly directed to the bonding region of the driving IC.

Exemplarily, as shown in FIG. 2, The plurality of input pads and the plurality of output pads form a first pad array and a second pad array, respectively. The first pad array and the second pad array are both in the bonding region, and the first pad array is closer to the display region relative to the second pad array. As shown in FIG. 2, the first pad array and the second pad array may include at least one row of pads.

In other embodiments, the groove 103 may be set between any two adjacent pads 101. The groove 103 is set between any two pads 101 to ensure that the area of the groove 103 is maximized, which thereby ensures a sufficient space for the ACF to flow and avoids the ACF from being difficult to flatten.

Furthermore, in this implementation manner, every groove 103 can be connected to each other to facilitate the flow of the ACF.

Certainly, above two implementation manners are only examples. In other implementation manners, a groove may be set at any position of the insulating layer of the bonding region as long as the insulation between pads is not affected.

Figure 3A:
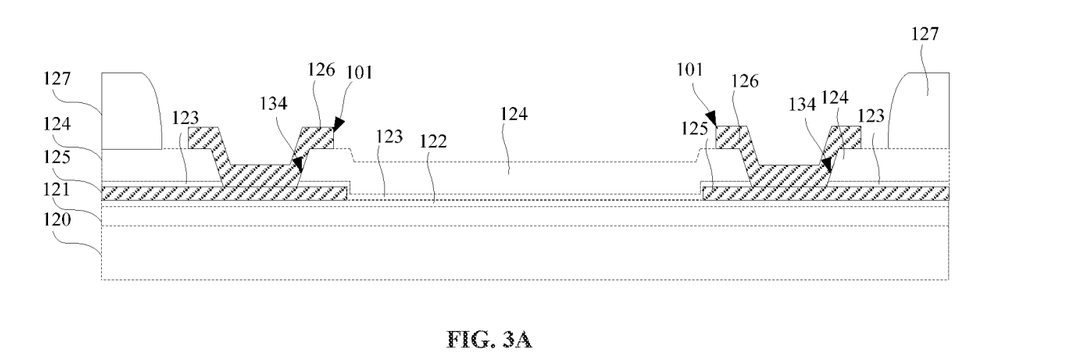
FIG. 3A is a structural schematic diagram of a bonding region of the display substrate in the related art.
Figure 3B:
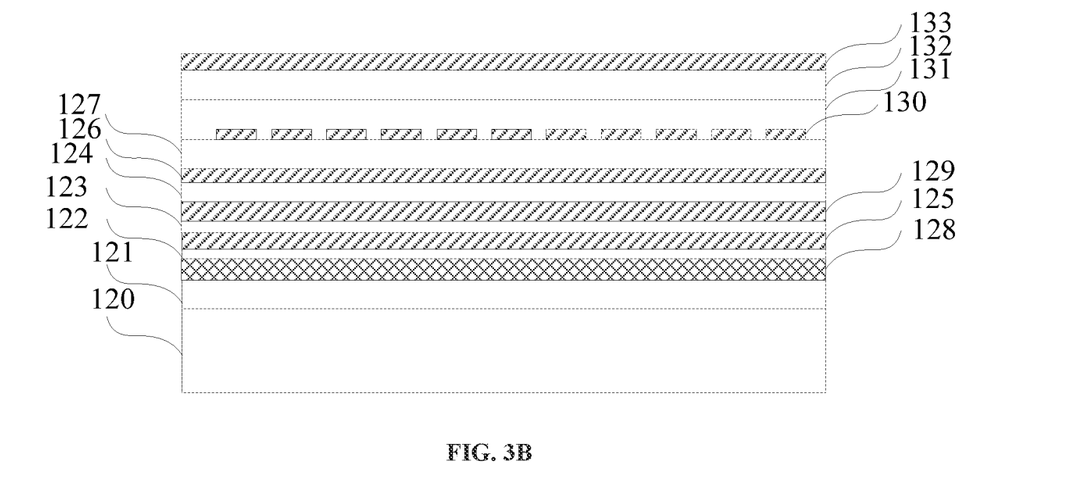
FIG. 3B is a structural schematic diagram of a display region of the display substrate in the related art.

FIG. 3A is a schematic diagram illustrating a film layer structure of a bonding region of the display substrate in the related art. As illustrated in FIG. 3A, the display substrate in the bonding region includes a base substrate 120, a buffer layer 121, a first insulating layer 122, a first metal layer (pad lead) 125, a second insulating layer 123, an interlayer insulating layer 124, a source/drain metal layer (pads 101) 126, and a flat layer 127. FIG. 3A illustrates a film layer structure of the bonding region of the display substrate. The film layer structure of the display substrate in the display region is illustrated in FIG. 3B and includes: a base substrate 120, and a buffer layer 121, an active layer 128, a first insulating layer 122, a first layer metal layer 125, a second insulating layer 123, a second metal layer 129, an interlayer insulating layer 124, a source/drain metal layer 126, a flat layer 127, an anode 130, a pixel defining layer 131, a light-emitting layer 132, and a cathode 133, which are sequentially disposed on the base substrate 120. Referring to FIG. 3B, the "sequentially disposed" means that above film layers are disposed on the base substrate 120 in order.

Thus, the insulating layer 102 of the foregoing bonding region includes the buffer layer 121, the first insulating layer 122, the second insulating layer 123, and the interlayer insulating layer 124, which are sequentially disposed on the base substrate 120. The first metal layer 125 is disposed between the first insulating layer 122 and the second insulating layer 123; the source/drain metal layer 126 and the flat layer 127 are disposed above the interlayer insulating layer 124; and via 134, through which the source/drain metal layer 126 passes and which is connected to the first metal layer 125, is set on the second insulating layer 123 and the interlayer insulating layer 124. It can be seen that the buffer layer 121, the first insulating layer 122, the second insulating layer 123 and the interlayer insulating layer 124 are between the source/drain metal layer 126 and the base substrate 120. The bonding region 100 is formed within the groove set in the flat layer 127.

Figure 4:
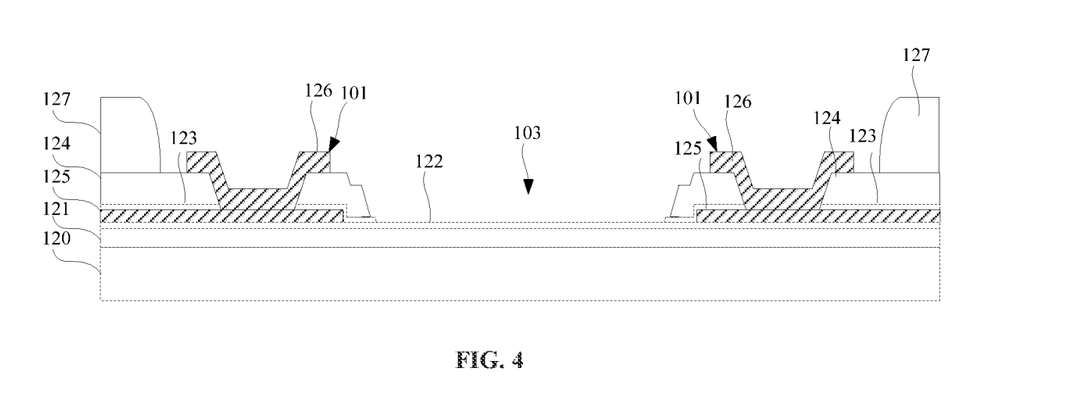
FIG. 4 is a structural schematic diagram of a display substrate provided in an embodiment of the present disclosure.

FIG. 4 is a schematic diagram illustrating film layer structure of a bonding region of a display substrate provided in an embodiment of the present disclosure. And FIG. 4 is a schematic sectional view of FIG. 2 along the direction A-A'. As illustrated in FIG. 4, FIG. 4 differs from FIG. 3A in that the groove 103 is set on the insulating layer. In the display substrate illustrated by FIG. 4, the depth of the groove 103 is equal to the sum of the thickness of the second insulating layer 123 and the interlayer insulating layer 124. The depth of the groove 103 is equal to the sum of the thicknesses of the second insulating layer 123 and the interlayer insulating layer 124. That is, the groove 103 penetrates the second insulating layer 123 and the interlayer insulating layer 124, and the bottom of the groove 103 is positioned at the first insulating layer 122. The groove 103 is set on the second insulating layer 123 and the interlayer insulating layer 124. Since the thickness of the interlayer insulating layer 124 is relatively large, the obtained depth of the groove 103 is relatively large, so that the fluidity requirement of the ACF can be satisfied. The groove 103 is set only on the second insulating layer 123 and the interlayer insulating layer 124, which not only can satisfy the requirement in depth of the groove 103 but also reduces the process steps required to set the groove 103. For the detailed process of manufacturing the groove 103, please refer to the method embodiment given later.

In the embodiment, the buffer layer 121 is disposed on the OLED substrate 120 to buffer the active layer 128 disposed on the base substrate 120. The first insulating layer 122, the second insulating layer 123, and the interlayer insulating layer 124 are mainly used for separating the active layer from the metal layer, and the metal layer from the metal layer, where the metal layer includes the foregoing first metal layer, second metal layer, and source/drain metal layer.

Figure 5:
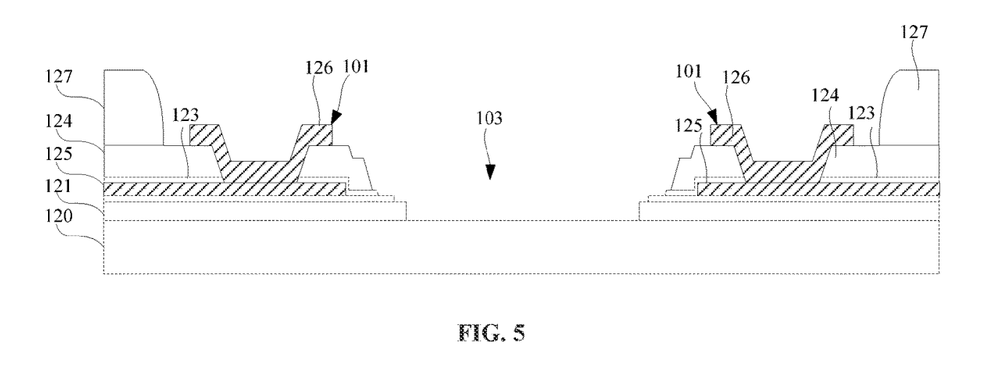
FIG. 5 is a structural schematic diagram of a display substrate provided in an embodiment of the present disclosure

FIG. 5 is a schematic diagram illustrating film layer structure of a bonding region of another display substrate of the embodiment of the present disclosure. And FIG. 5 is another schematic sectional view of FIG. 2 along the direction A-A'. As illustrated by FIG. 5, the depth of the groove 103 is equal to the thickness of the insulating layer 102. The groove 103 also penetrates the buffer layer 121 in the insulating layer 102, the first insulating layer 122, the second insulating layer 123, and the interlayer insulating layer 124. The bottom of the groove 103 is positioned on the base substrate 120. At this point, the depth of the groove 103 reaches the maximum, thereby ensuring the fluidity of the ACF to the utmost.

As illustrated in FIGS. 4 and 5, the groove 103 tends to gradually widen from the bottom to the opening, and this design facilitates the patterning of the film layer.

In the embodiment of the present disclosure, in order to ensure that the groove 103 does not affect the insulation performance between the pads, there is a certain distance, for example, 5 mm etc., between the opening of the groove 103 and the edge of the pads.

The embodiment of the present disclosure further provides a display panel, and the display panel includes the display substrate as illustrated by any one of the FIGS. 2, 4 and 5.

In the embodiment of the present disclosure, the groove 103 is set in the insulating layer 102 between at least two adjacent pads of the bonding region to enable the ACF to flow to the groove 103 as pressed. This ensures that the ACF can be evenly distributed in the region between at least two adjacent pads, which thereby solves the problem of unevenness introduced by the glue expelling difficulty in the ACF between the display substrate and the driving IC, avoids the occurrence of bubbles caused by unevenness of the ACF, and ensures the electrical connection between the display substrate and the driving IC.

The embodiment of the present disclosure further provides a display device, and the display device includes the display panel as described above.

The display device provided in the embodiment of the present disclosure may be any products or parts having a display function, such as a mobile phone, a tablet computer, a TV, a display, a notebook computer, a digital photo frame, or a navigator etc.

In the embodiment of the present disclosure, the groove 103 is set in the insulating layer 102 between at least two adjacent pads of the bonding region to enable the ACF to flow to the groove 103 as pressed. This ensures that the ACF can be evenly distributed in the region between at least two adjacent pads, which thereby solves the problem of unevenness introduced by the glue expelling difficulty in the ACF between the display substrate and the driving IC, avoids the occurrence of bubbles caused by unevenness of the ACF, and ensures the electrical connection between the display substrate and the driving IC.

The embodiment of the present disclosure further provides a method for manufacturing a display substrate, and the method includes: forming a plurality of pads disposed at intervals in a bonding region of a display substrate. The pads are separated by an insulating layer; and a groove in the insulating layer is set between at least two adjacent pads.

The method for manufacturing the display substrate provided in the embodiment of the present disclosure will be described in detail below with reference to FIG. 6.

Figure 6:
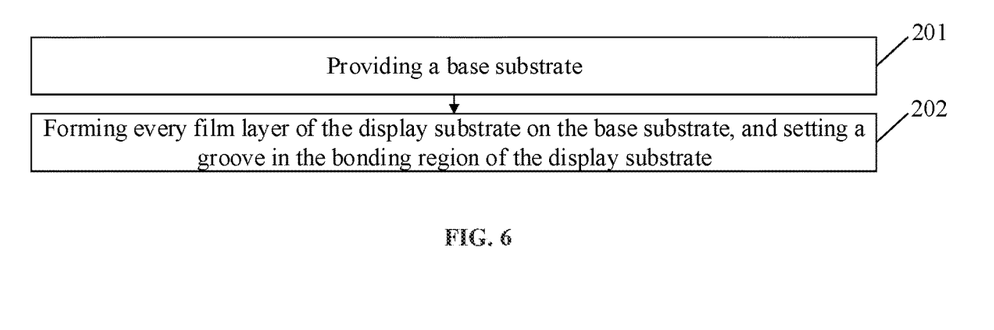
FIG. 6 is a flowchart of a method for manufacturing a display substrate provided in an embodiment of the present disclosure.

FIG. 6 is a flowchart illustrating the method for manufacturing a display substrate provided in an embodiment of the present disclosure. Referring to FIG. 6, the method includes following steps.

In step 201, a base substrate is provided.

In the embodiment of the present disclosure, the base substrate may be a transparent substrate, such as, a glass substrate, a silicon substrate, a plastic substrate, or the like.

In step 202, every film layer of the display substrate is formed on the base substrate, and a groove is set in the bonding region of the display substrate. The bonding region is provided with a plurality of pads disposed at intervals and the pads are separated by insulating layers, and a groove is set on the insulating layer between at least two adjacent pads.

In the embodiment of the present disclosure, a groove is set on the insulating layer between at least two adjacent pads, thereby avoiding the glue expelling difficulty when the ACF is adopted for the bonding process.

In the embodiment of the present disclosure, the groove can be set by following two implementation manners.

One implementation manner is to directly form an insulating layer having a groove as manufacturing the insulating layer. That is, the insulating layer needs to further form a groove based on the original shape. The other implementation manner is to form a groove by removing a portion of the insulating layer between at least two adjacent pads with a patterning process after the manufacturing of the insulating layer is completed.

The implementation manners provide two ways to set the groove. In the first manner, the groove is set in the process of manufacturing the insulating layer. Since the patterning processing also needs to be performed to some insulating film layers during the process of manufacturing the insulating layer, the groove in those insulating film layers can be simultaneously set in the original patterning processing. In order to set the groove in the original patterning processing, only the pattern of the mask plate needs to be updated without needing a new process step. Thus, a process step of setting the groove can be saved if adopting the first manner. In the second manner, the groove is set after manufacturing of the insulating layer is completed. In this way, it is not necessary to update the pattern of the mask plate of the insulating film layer, and instead, only a new mask plate is needed to complete the groove setting, which can better control the shape and size of the formed groove.

Since the second manner only needs to add a patterning process in the end, it will not be explained in detail here. For the first manner, it will be described below in detail.

Directly forming the insulating layer having the groove as manufacturing the insulating layer includes: manufacturing a layer of insulating film and removing a portion of the insulating film between at least two adjacent pads as patterning the insulating film to obtain a first sub-insulating layer. The first sub-insulating layer is a sub-insulating layer of the insulating layer that includes a plurality of sub-insulating layers sequentially disposed on the base substrate. The first sub-insulating layer here is any one of the sub-insulating layers of the insulating layer, and any one sub-insulating layer of the insulating layers shall be processed as described above if required to set the groove.

Or, directly forming the insulating layer having the groove as manufacturing the insulating layer includes: sequentially manufacturing at least two layers of insulating film, and removing a portion of the at least two layers of insulating film between at least two adjacent pads as patterning the at least two layers of insulating film to obtain at least two sub-insulating layers. The at least two sub-insulating layers are at least two consecutive sub-insulating layers of the insulating layer that includes a plurality of sub-insulating layers sequentially disposed on the base substrate.

It can be seen that there are two manners in the present disclosure for directly forming the insulating layer having the groove. One is to form the groove layer by layer, and the other is to form the groove simultaneously by two or more layers.

If the insulating layer includes a plurality of sub-insulating layers, the depth of the groove is greater than or equal to the thickness of the uppermost sub-insulating layer among the plurality of sub-insulating layers.

Furthermore, the depth of the groove is greater than or equal to the sum of the thicknesses of the two uppermost sub-insulating layers among the plurality of sub-insulation layers, so that the depth of the groove can ensure the ACF to expel glue smoothly.

For example, a groove may be set in the two uppermost sub-insulating layers among the plurality of sub-insulating layers. At this point, directly forming the insulating layer having the groove as manufacturing the insulating layer may include: manufacturing a first insulating film and removing a portion of the first insulating film between at least two adjacent pads as patterning the first insulating film to obtain a first sub-insulating layer which is the second sub-insulating layer from top to bottom among the plurality of sub-insulating layers; and forming a second insulating film on the first sub-insulating layer and removing a portion of the second insulating film between at least two adjacent pads as patterning the second insulating film to obtain a second sub-insulating layer which is the uppermost sub-insulating layer among the plurality of sub-insulating layers. That is, the groove shall also be formed in above patterning process besides forming the original pattern of the sub-insulating layer. The portion removed from each sub-insulating layer is a portion of the groove, which may be called as a sub-groove.

Alternatively, directly forming the insulating layer having the groove as manufacturing the insulating layer may include: manufacturing a first insulating film and a second insulating film and removing a portion of the first insulating film and second insulating film between at least two adjacent pads as patterning the first insulating film and the second insulating film to obtain a first sub-insulating layer and a second sub-insulating layer which are the two uppermost sub-insulating layers among the plurality of sub-insulating layers. It should be noted that the manner is applicable to the following two scenarios. The first scenario is that the first sub-insulating layer and the second sub-insulating layer have the same pattern and in this case performing a patterning process with a common mask can be adopted. The second scenario is that the first sub-insulating layer is positioned under the second sub-insulating layer and the projection of the pattern of the first sub-insulating layer on the base substrate is within the projection of the pattern of the second sub-insulating layer on the base substrate. In this case, a grayscale mask is used to realize the patterning process, so that some patterns can be simultaneously formed on the first sub-insulating layer and the second sub-insulating layer, and some patterns are formed only on the second sub-insulating layer.

In the embodiment of the present disclosure, when there are a plurality of sub-insulating layers, the groove may be formed on the uppermost two sub-insulating layers, which, on the one hand, ensures the ACF to expel glue smoothly, and, on the other hand, makes it easier to implement only by patterning two film layers. In this manner, the two film layers can be either patterned separately or patterned together to form two sub-insulating layers.

Optionally, when the number of the sub-insulating layers is greater than or equal to 4, the groove may also be set on the uppermost four sub-insulating layers as manufacturing the insulating layer. At this point, directly forming the insulating layer having the groove may further include: manufacturing a third insulating film and removing a portion of the third insulating film between at least two adjacent pads as patterning the third insulating film to obtain a third sub-insulating layer which is the fourth sub-insulating layers from top to bottom among the plurality of sub-insulating layers; and forming a fourth insulating film on the third sub-insulating layer, and removing a portion of the fourth insulating film between at least two adjacent pads as patterning the fourth insulating film to obtain a fourth sub-insulating layer which is the third sub-insulating layer from top to bottom among the plurality of sub-insulating layers.

Alternatively, directly forming the insulating layer having the groove as manufacturing the insulating layer may further include: manufacturing a third insulating film and a fourth insulating film, and removing a portion of the third insulating film and fourth insulating film between at least two adjacent pads as patterning the third insulating film and the fourth insulating film to obtain a third sub-insulating layer and a fourth sub-insulating layer which are the fourth one and the third sub-insulating layer from top to bottom among the plurality of sub-insulating layers.

The processing manners of the third and fourth sub-insulating layers are the same as those of the forgoing first and second sub-insulating layers, and thereby are not repeated here.

When the number of the sub-insulating layers is greater than or equal to 4, the groove can not only be formed on the uppermost four sub-insulating layers but also further ensures the ACF to expel glue smoothly.

The forming of the groove will be described below in conjunction with the structure of the display substrate. For example, every film layers of the display substrate which grows on the base substrate may include a buffer layer, an active layer, a first insulating layer, a first metal layer, a second insulating layer, a second metal layer, an interlayer insulating layer, a source/drain metal layer, a flat layer, an anode, a pixel defining layer, a light-emitting layer, and a cathode sequentially growing on the display substrate a base substrate. In above structure, the first metal layer and the second metal layer are used for forming gate lines, gate of thin film transistors, leads (including pad leads), and one pole of storage capacitors, such as forming the leads by adopting a first metal layer, and forming gate lines, gate of the thin film transistors, and one pole of the storage capacitors by adopting a second metal layer. The source/drain metal layer is used for forming pads, data lines, source/drain electrodes of the thin film transistors, and the other electrode of storage capacitors. In above structure, the thin film transistor is explained by taking a top-gate thin film transistor as the example, and in other embodiments, above display substrate can also adopt a bottom-gate thin film transistor, which is not limited by the present disclosure. The materials of the respective film layers are described as above and will not be repeated here.

In above structure, the insulating layer may include four sub-insulating layers, which are respectively a buffer layer, a first insulating layer, a second insulating layer, and an interlayer insulating layer.

Directly forming the insulating layer having the groove as manufacturing the insulating layer may include: removing a portion of the second insulating layer between at least two adjacent pads as patterning the second insulating layer; and removing a portion of the interlayer insulating layer between at least two adjacent pads as patterning the interlayer insulating layer. In the process of manufacturing the display substrate, some insulating film layers need to be patterned per se, and setting the groove on those insulating film layer can be simultaneously performed in the original patterning process, thereby saving a process step.

Taking this manner as an example, the complete procedure of the method for manufacturing the display substrate provided in the embodiment of the present disclosure will be briefly described below, including: a buffer layer, an active layer, a first insulating layer, a first metal layer, and a second insulating layer sequentially growing on the base substrate, and removing a portion of the second insulating layer between at least two adjacent pads as patterning the second insulating layer. The second metal layer and the interlayer insulating layer sequentially grow on the patterned second insulating layer, and a portion of the interlayer insulating layer between at least two adjacent pads is removed as patterning the interlayer insulating layer. A source/drain metal layer, a flat layer, an anode, a pixel defining layer, a light-emitting layer, and a cathode sequentially grow on the patterned interlayer insulating layer.

Alternatively, directly forming the insulating layer having the groove as manufacturing the insulating layer may include: simultaneously removing a portion of the second insulating layer and interlayer insulating layer between at least two adjacent pads as patterning the interlayer insulating layer.

In this implementation manner, the groove is set on the second insulating layer and the interlayer insulating layer in two ways. One way has two steps, that is, setting the groove in the second insulating layer as patterning the second insulating film, and then setting the groove in the interlayer insulating layer as patterning the interlayer insulating layer; this way makes manufacture easy and needs low process requirements. The other way is to set the groove once. For example, the groove is set on the interlayer insulating layer and the second insulating layer once as patterning the interlayer insulating layer, which can be completed in one step by dry etching or in two steps by wet etching (etching the interlayer insulating layer and the second insulating layer respectively with different etching solutions).

Furthermore, the groove is set on the second insulating layer and the interlayer insulating layer. Since the thickness of the interlayer insulating layer is relatively large, the depth of the obtained groove is large, so that the fluidity requirement of the ACF can be satisfied.

In the embodiment of the present disclosure, directly forming the insulating layer having the groove as manufacturing the insulating layer may further include: simultaneously removing a portion of the buffer layer between at least two adjacent pads as patterning the buffer layer; and simultaneously removing a portion of the first insulating layer between at least two adjacent pads as patterning the first insulating layer.

The portion of the first insulating layer between at least two adjacent pads is simultaneously removed as patterning the first insulating layer.

Alternatively, directly forming the insulating layer having the groove as manufacturing the insulating layer may further include: simultaneously removing a portion of the buffer layer and first insulating layer between at least two adjacent pads as patterning the first insulating layer.

Certainly, the embodiment of the present disclosure may further include simultaneously removing a portion of the buffer layer and first insulating layer between at least two adjacent pads as patterning the second insulating layer or the interlayer insulating layer. In terms of three film layers or four film layers, it is difficult for their patterned patterns to be the same or satisfy the aforementioned size relationship (the projection of the pattern of the lower film layer on the base substrate is within the projection of the pattern of the upper film layer on the base substrate). Therefore, usually the manner of patterning two films once is adopted.

In this implementation manner, the groove is set on the buffer layer, the first insulating layer, the second insulating layer, and the interlayer insulating layer in many manners. For example, every time when an insulating layer is manufactured, the groove is set on the insulating layer. Or, every time when two insulating layers are manufactured, the groove is set. Or, after three insulating layers are consecutively manufactured, the groove is set on the three insulating layers. Or, after four insulating layers are manufactured consecutively, the groove is set on the four insulating layers. In above manufacturing step, both dry etching and wet etching may be used to set the groove after a layer is manufactured; however, when the groove is set once on two or more layers, it can be completed in one step by dry etching or in two or more steps by wet etching (etching each film layer with different etching solutions).

Furthermore, in this implementation manner, the groove is further deepened, thereby ensuring the fluidity of the ACF to the utmost.

In one implementation manner of the embodiment of the present disclosure, a groove is formed between any two adjacent pads. Setting the groove between any two pads may ensure that the area of the groove to be maximized, which thereby ensures a sufficient space for the ACF to flow and avoids the case that the ACF is difficult to flatten.

In another implementation manner of the embodiment of the present disclosure, the pads include inputs pad and output pads, and the bonding region includes a first region where the input pads are positioned and a second region where the output pads are positioned respectively. Setting the groove includes setting the groove between the first region and the second region. That is, the groove is set between the first region and the second region. In this implementation manner, the pads are centrally disposed in two regions, and there is a large vacant area between the two regions, thus, the groove may be set only in the region between the input pads and the output pads. And since the area of this portion of the region is relatively large, patterning process may be easily performed if the groove is set. On the one hand, the process becomes simple to implement, and on the other hand, the problem that the groove is set between two pads of the same region which caused a decrease of insulating performance between the pads can be prevented.

The foregoing descriptions are only exemplary embodiments of the present disclosure and are not intended to limit the present disclosure. Within the spirit and principles of the disclosure, any modifications, equivalent substitutions, improvements, etc., are within the protection scope of the appended claims of the present disclosure.

The invention claimed is:

1. A display substrate, comprising a bonding region; a plurality of pads at intervals in the bonding region; and an insulating layer for spacing apart the pads;
   wherein,
   a groove is in the insulating layer between at least two adjacent pads, the groove is configured to accommodate an overflow anisotropic conductive film during a bonding process; and
   wherein,
   the display substrate further comprising: a base substrate, an active layer, a first metal layer, a second metal layer, a drain/source metal layer, a flat layer, an anode, a pixel defining layer, a light-emitting layer and a cathode;
   the insulating layer comprises a buffer layer, a first insulating layer, a second insulating layer, and an interlayer insulating layer;
   the buffer layer, the active layer, the first insulating layer, the first metal layer, the second insulating layer, the second metal layer, the interlayer insulating layer, the source/drain metal layer, the flat layer, the anode, the pixel defining layer, the light-emitting layer, and the cathode are sequentially on the base substrate; and
   a depth of the groove is no less than a sum of thicknesses of the second insulating layer and the interlayer insulating layer.

2. The display substrate according to claim 1, wherein the groove is between any two adjacent pads.

3. The display substrate according to claim 1, wherein the pads comprise input pads and output pads, and the bonding region comprises a first region and a second region at intervals, wherein the input pads are in the first region, the output pads are in the second region, and the groove is between the first region and the second region.

4. The display substrate according to claim 1, wherein a depth of the groove is no less than a thickness of an uppermost sub-insulating layer among the plurality of sub-insulating layers, and the uppermost sub-insulating layer is a sub-insulating layer farthest from the base substrate.

5. The display substrate according to claim 1, wherein a depth of the groove is equal to a thickness of the insulating layer.

6. A method for manufacturing a display substrate, comprising:
   providing a base substrate; and
   forming film layers on the base substrate and setting a groove in a bonding region of the display substrate;
   wherein the display substrate is the display substrate according to claim 1, and
   the film layers comprise an active layer, a first metal layer, a second metal layer, a drain/source metal layer, a flat layer, an anode, a pixel defining layer, a light-emitting layer and a cathode.

7. The method according to claim 6, wherein setting the groove in the bonding region of the display substrate comprises:
   directly forming the insulating layer having the groove as manufacturing the insulating layer.

8. The method according to claim 7, wherein directly forming the insulating layer having the groove as manufacturing the insulating layer comprises:
   removing a portion of the second insulating layer between at least two adjacent pads as patterning the second insulating layer and removing a portion of the interlayer insulating layer between at least two adjacent pads as patterning the interlayer insulating layer, or
   simultaneously removing a portion of the second insulating layer and interlayer insulating layer between at least two adjacent pads as patterning the interlayer insulating layer.

9. The method according to claim 8, wherein directly forming the insulating layer having the groove as manufacturing the insulating layer further comprises:
   simultaneously removing a portion of the buffer layer between at least two adjacent pads as patterning the buffer layer; and simultaneously removing a portion of the first insulating layer between at least two adjacent pads as patterning the first insulating layer; or
   simultaneously removing a portion of the buffer layer and the first insulating layer between at least two adjacent pads as patterning the first insulating layer.

10. A display panel, comprising: a display substrate; wherein, the display substrate comprises: a bonding region; a plurality of pads at intervals in the bonding region; and an insulating layer for spacing apart the pads, wherein a groove is in the insulating layer between at least two adjacent pads; and wherein, the display substrate further comprises: a base substrate, an active layer, a first metal layer, a second metal layer, a drain/source metal layer, a flat layer, an anode, a pixel defining layer, a light-emitting layer and a cathode;

the insulating layer comprises a buffer layer, a first insulating layer, a second insulating layer, and an interlayer insulating layer;

the buffer layer, the active layer, the first insulating layer, the first metal layer, the second insulating layer, the second metal layer, the interlayer insulating layer, the source/drain metal layer, the flat layer, the anode, the pixel defining layer, the light-emitting layer, and the cathode are sequentially on the base substrate; and a depth of the groove is no less than a sum of thicknesses of the second insulating layer and the interlayer insulating layer.

11. The display panel according to claim 10, wherein the groove is between any two adjacent pads.

12. The display panel according to claim 10, wherein the pads comprise input pads and output pads, and the bonding region comprises a first region and a second region at intervals, wherein the input pads are in the first region, the output pads are in the second region, and the groove is set between the first region and the second region.

13. The display panel according to claim 10, wherein a depth of the groove is no less than a thickness of an uppermost sub-insulating layer among the plurality of sub-insulating layers, and the uppermost sub-insulating layer is a sub-insulating layer farthest from the base substrate.

14. A display device, comprising the display panel of claim 10.

15. The display panel according to claim 10, wherein a depth of the groove is equal to a thickness of the insulating layer.

16. A display substrate, comprising:

a base substrate;

at least one insulating layer on a side of the base substrate;

a first pad array on a side of the at least one insulating layer away from the base substrate;

a second pad array on the side of the at least one insulating layer away from the base substrate;

a groove in the at least one insulating layer between the first pad array and the second pad array;

wherein the display substrate comprises a display region and a bonding region on a side of the display region;

the first pad array and the second pad array are both in the bonding region, and the first pad array is closer to the display region relative to the second pad array; and the groove is configured to accommodate an overflow anisotropic conductive film during a bonding process; and wherein, the display substrate further comprising: an active layer, a first metal layer, a second metal layer, a drain/source metal layer, a flat layer, an anode, a pixel defining layer, a light-emitting layer and a cathode;

the insulating layer comprises a buffer layer, a first insulating layer, a second insulating layer, and an interlayer insulating layer;

the buffer layer, the active layer, the first insulating layer, the first metal layer, the second insulating layer, the second metal layer, the interlayer insulating layer, the source/drain metal layer, the flat layer, the anode, the pixel defining layer, the light-emitting layer, and the cathode are sequentially on the base substrate; and a depth of the groove is no less than a sum of thicknesses of the second insulating layer and the interlayer insulating layer.

17. The display substrate according to claim 16, wherein a depth of the groove is no less than a thickness of an uppermost sub-insulating layer among the plurality of sub-insulating layers, and the uppermost sub-insulating layer is a sub-insulating layer farthest from the base substrate.

18. The display substrate according to claim 16, wherein a depth of the groove is equal to a thickness of the insulating layer.

19. The display substrate according to claim 16, wherein the bonding region is in the groove in the flat layer.

20. A display device, comprising: the display panel according to claim 16.

* * * * *